United States Patent [19]
DePaolis, Jr.

[11] Patent Number: 5,917,769
[45] Date of Patent: Jun. 29, 1999

[54] METHOD AND SYSTEM ROTATING DATA IN A MEMORY ARRAY DEVICE

[75] Inventor: Michael V. DePaolis, Jr., Center Valley, Pa.

[73] Assignee: Lucent Technologies Inc., Murray Hill, N.J.

[21] Appl. No.: 08/909,866

[22] Filed: Aug. 12, 1997

[51] Int. Cl.[6] .................................................. G11C 7/00
[52] U.S. Cl. ................ 365/220; 365/189.04; 365/230.05
[58] Field of Search ..................................... 365/219, 220, 365/221, 189.04, 230.05, 230.09

[56] References Cited

U.S. PATENT DOCUMENTS

| | | | |
|---|---|---|---|
| 4,660,177 | 4/1987 | O'Conner | 365/189 |
| 5,157,775 | 10/1992 | Sanger | 365/230.05 |
| 5,282,174 | 1/1994 | Little | 365/230.05 |
| 5,327,386 | 7/1994 | Fudeyasu | 365/221 |
| 5,412,740 | 5/1995 | Fadavi-Ardekani | 382/293 |
| 5,448,714 | 9/1995 | Stodieck | 365/230.05 |
| 5,477,489 | 12/1995 | Wiedmann | 365/189.04 |
| 5,477,502 | 12/1995 | Hayashi | 365/230.05 |

Primary Examiner—Son Mai

[57] ABSTRACT

A method and system of utilizing a memory array device contained within an integrated circuit within the printer device is provided in which data bits are written in a row format, thereby filling an N×M memory array device and then read in a column format. An N×M memory array device is employed such as a 32×32 bit memory array. During the reading phase, data from a computer is read by the memory device in a parallel fashion so that data is written sequentially a row of memory cells, such as B0W0, B1W0, B2W0 . . . etc. Once the memory array is loaded up, the writing phase is accomplished by performing a parallel dump wherein all of the memory cells of the first column are read together such that a column of memory cells, such as B0W0 to B0W31 is read first, a column of memory cells, such as B1W0 to B1W31 is read second, a column of memory cells B2W0 to B2W31 is read third etc. The N×M memory array device is read in a column format instead of the standard row format. As is evident, one or more arrays may be utilized.

9 Claims, 1 Drawing Sheet

METHOD AND SYSTEM ROTATING DATA IN A MEMORY ARRAY DEVICE

FIELD OF THE INVENTION

This invention relates to a method and system of utilizing a memory array device in which data bits are written in a row format, thereby filling an N×M memory array device and then read in a column format.

BACKGROUND OF THE INVENTION

With the advent of the information age, personal computers (PC's) have created a profound impact on society as a whole. Together with an associated printer device, individuals may now print from PC's documents that were once typed by typewriter or type-set by hand. In such operations, the data coming from the PC is provided via a parallel interface which is located within the printer device. In some printer applications it is necessary to store an incoming word byte from a computer in a row format and allow the printer to read individual bits of each word in a column format.

Typical arrangements for implementing the requirement to write word bytes in a row format and read bits of data in a column format employ columns of shift registers coupled together in parallel. Each bit of an incoming word is stored in a corresponding location of a register column. As the next word arrives, each shift register shifts down the bits of the previous word by one location. After the time that a plurality of words, such as 32 words, each 32 bits long, have arrived, data stored in each shift register column, is read, one column at a time.

An example of the utilization of such row to column transformation may be found in Hewlett-Packard printers which write data words in row arrangements using standard RS232 bust interface, and read the data words in a column arrangement.

The use of multiple shift registers for the row to column transformation discussed above may lead to throughput delays and may also be costly. Thus, there is a need for an improved data transformation arrangement that leads to substantially fast response time and that is substantially less costly to manufacture.

SUMMARY OF THE INVENTION

A method and system of utilizing a memory array device contained within an integrated circuit is provided in which data bits are written in a row format, thereby filling an N×M memory array device and then read in a column format.

In accordance with one embodiment of the present invention, an N×M memory array device is employed such as a 32×32 bit memory array. During the reading phase, data from a data source is read by the memory device in a parallel fashion so that data is written sequentially in a row of memory cells at a time, such as rows R(0), R(1), R(2) . . . etc. Once the memory array is loaded up, the writing phase is accomplished by performing a parallel dump wherein all of the memory cells of the first column are read first, a column of memory cells, such as B1W0 to B1W31 read second, a column of memory cells B2W0 to B2W31 read third, etc. In this way, the N×M memory array device is read in a column format instead of the standard row format. Additionally, in an integrated circuit embodiment, reduction in area will be substantial. As is evident, one or more arrays may be utilized. Additionally, any size array of cells (N×M) such as a 16×16 or 128×128 array may be utilized. Two or more of these arrays may be used in parallel so that while data in one memory array is being written, the data in the other memory array is being read.

BRIEF DESCRIPTION OF THE DRAWINGS

One embodiment of the invention will now be described by way of example, with reference to the accompanying drawings, in which.

DETAILED DESCRIPTION OF THE PRESENTLY PREFERRED EMBODIMENTS

Figure 1:
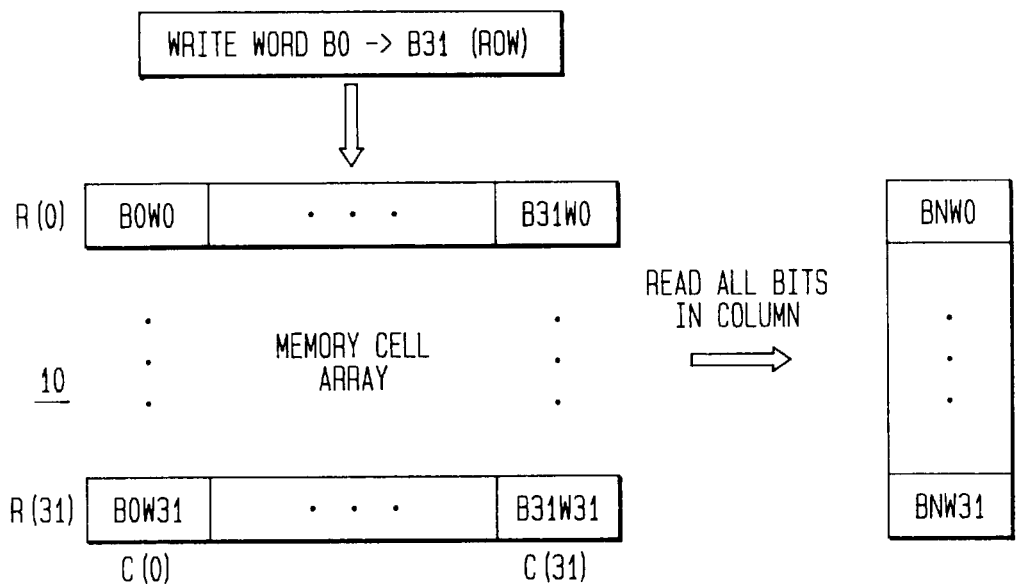
FIG. 1 is an illustration of a 32×32 memory cell array in accordance with one embodiment of the present invention.

With initial reference to FIG. 1, a 32×32 memory cell array 10 is shown. As illustrated, memory cell array 10 has 32 rows, R(0) . . . R(31), and 32 columns, C(0) . . . C(31). In operation, bits of data words are provided from a data source, for example, a computer (not shown) via typically, a parallel interface connector (also not shown). In certain applications rows of data have to be read in a column format as explained in more detail hereinafter. In one embodiment of the invention, memory cell array 10 is located within an integrated circuit within a printer (not shown), although the invention is not limited in scope in that respect.

In use, data words are provided in a row format, such that for example, bits B0 through B31 of word W0 are stored simultaneously in a selected row of memory cells B0W0 through B31W0 respectively. The bits of the next word byte would be placed in the second selected row R1 such that bits B0 through B31 of word W1 are stored simultaneously in memory cells B1W1 through B31W1. Similarly, data would be placed in all cells thereby filling rows R(3) through R(32). Once these cells are loaded up, a parallel dump is performed such that all of the cells of the first selected column, C(1), are read in parallel so that the bits in columns 1 through columns 32 are read as one word.

Although, reference is made to a single 32×32 memory cell array 10, any dimension N×M memory cell array such as a 16×16 or 128×128 array may be utilized. Furthermore, one or more arrays operating in either or both write or read modes may be employed. By utilizing such a method and system a standard RS 232 type bus interface (not shown) for printer interface may be utilized.

Figure 2:
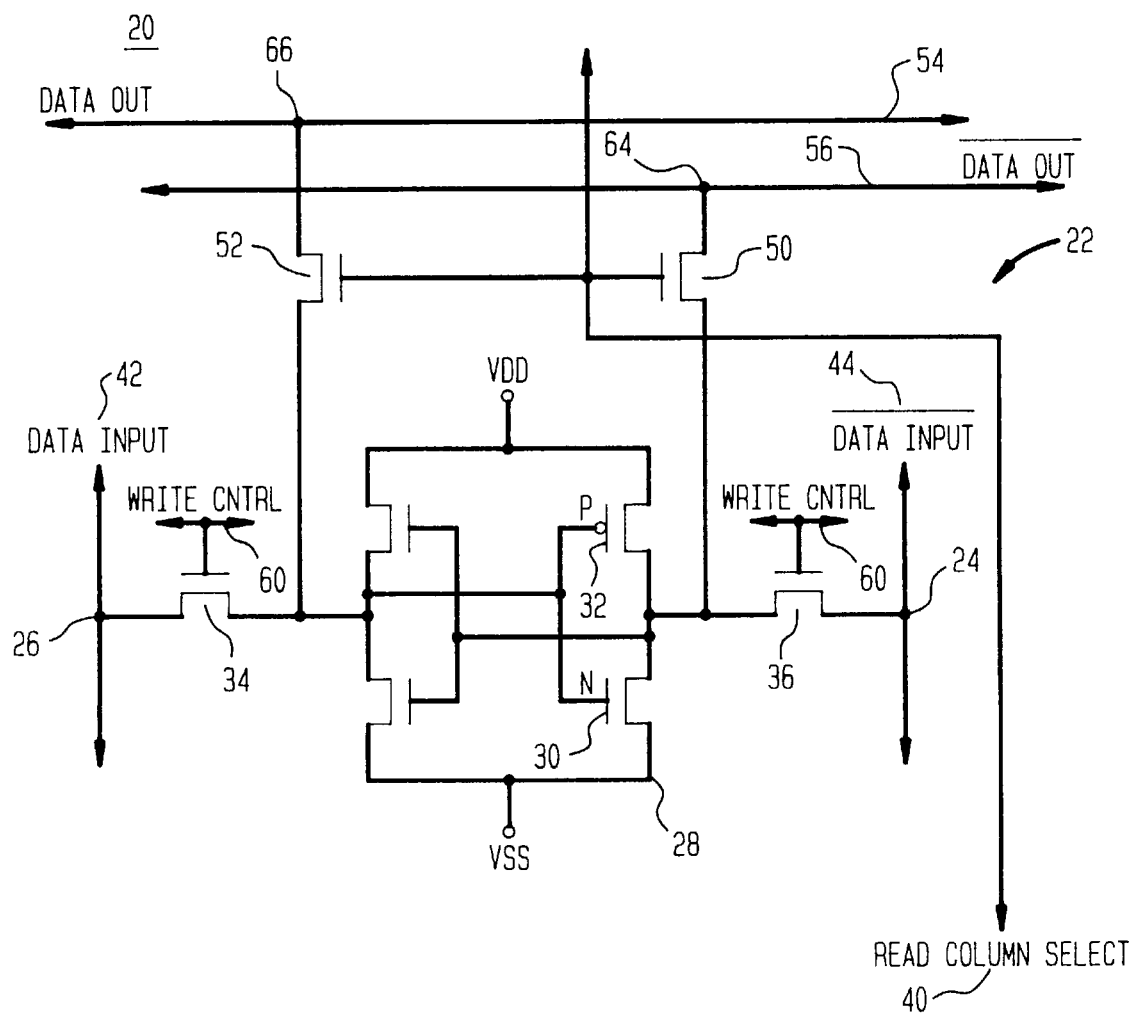
FIG. 2 is a schematic diagram of a memory cell in accordance with an embodiment of the present invention.

FIG. 2 illustrates a schematic diagram of a memory cell 20 that defines the memory cell array in accordance with one embodiment of the present invention, although the invention is not limited in scope in that respect. A memory cell array in accordance with one embodiment of the present invention comprises a plurality of memory cells such as 20, as explained hereinafter.

With reference to FIG. 2, a rotator memory cell, such as 20 is provided which includes a dual input and output ports. The dual input port of memory cell 20 comprises a right input port 24 and a left input port 26. The dual output port of memory cell 20 comprises a right output port 64 and a left output port 66. A storage element 28, which in accordance with one exemplary embodiment of the present invention is a cross coupled latched device is configured to receive the voltage signal provided at data input ports 24 and 26 respectively via data input switch transistors 36 and 34 respectively, although the invention is not limited in scope in that respect and other storage elements may be employed.

Storage element 28 includes a couple of n channel MOSFETs 30 that are cross connected to a couple of p channel MOSFETs 32. More specifically, the gate terminal of each p channel MOSFET 32 is coupled to the gate terminal of the corresponding n channel MOSFET 30 and to the source terminal of the other p-channel MOSFET. The source terminal of p-channel MOSFET 32 is coupled to the drain terminal of n-channel MOSFET 30. The drain terminal of p-channel MOSFET 32 is coupled to a high level power voltage signal source VDD, and the source terminal of n-channel MOSFET 30 is coupled to a low level power voltage signal source VSS. Each data bit is stored as a voltage signal level at the drain terminal of n-channel MOSFET 30, or the source terminal of p-channel MOSFET 32. This data bit is available to data out lines 54 and 56 respectively via data output switch transistors 52 and 50 respectively.

Switch transistors 34 and 36 are actuated by a voltage signal level, defined as write row select signal that is provided via row control line 60. It is noted that each memory cell, such as 20, which is located within a row of memory cells receives a corresponding bit of a word byte via a corresponding data input line 42 and 44 respectively. To this end, row control line 60 along a row of memory cells would carry a voltage signal level that activates the corresponding data input switches, such as 34 and 36 along a selected row simultaneously.

Similarly, data output switch transistors 52 and 50 are actuated by a voltage signal level, defined as read column select signal that is provided via column control line 40. It is noted that each memory cell, such as 20, which is located within a column of memory cells provides a corresponding bit of a column word via a corresponding data output line 54 and 56 respectively. To this end, column control line 40 along a column of memory cells would carry a voltage signal level that activates the corresponding data output switches, such as 52 and 50, along a selected column simultaneously.

During operation, in order to write a data word, the data enters in parallel fashion, with the first bit being stored in cell B0W0, the second bit being stored in cell B1W0, and so forth, thirty two times across and thirty two times down. For each row of data the corresponding row control line 60 carries a voltage signal level that activates the data input switch transistors of all memory cells within that row. Thus, each data word is written into a corresponding selected row of memory cells, one row at a time. Accordingly, once the data is written into the first row, R1, the row control line carries an activating write row select signal in the second row so that data input switch transistors 34, and 36 of the second row R1 is activated and memory cells B0W1 through B31W1 are loaded with appropriate data bits. Data from the computer is continued to be stored into each row R3 through R31, until data is stored in each of the 32×32 cells. At that point, the row control lines in the memory cell array will cease to carry write row select signal levels thereby disenabling write control mechanism for storing bits of incoming data.

Next, read column control lines would be activated to carry read column select signals on a column by column basis so as to allow all data bits stored along a selected column of memory cells be read at once via data out lines 54 and 56. Once enabled the data output switch transistors 50 and 52 provide the data bit stored in the corresponding memory cell to data out lines 54 and 56. Thus memory cells along the first selected column such as B0W0 through B0W31 are read together, when the corresponding read column control line for that column carries an activating read column select signal. It is noted that in accordance with another embodiment of the invention, the selected rows and columns may be activated at a predetermined order, as opposed to the sequential order explained above.

It should be understood that the preferred embodiments and examples described are for illustrative purposes only and are not to be construed as limiting the scope of the present invention which is properly delineated only in the appended claims.

What is claimed is:

1. An integrated circuit having a memory cell array comprising:

a plurality of N×M memory cells configured in a selectable column and a selectable row format, wherein each of said selectable rows is comprised of N memory cells and each of said selectable columns is comprised of M memory cells;

a data input switch coupled to each one of said memory cells for receiving a data bit from a data input line during a write operation;

a data output switch couple to each of said memory cells for providing a data bit to a data output line during a read operation;

a row control line coupled to said data input switch and configured to carry a write row select signal so as to activate a plurality of said data input switches across a row of said memory cells such that data is written in parallel into a selected row of said N memory cells; and a column control line configured to carry a read column select signal so as to activate said data output switches across a column of said memory cells such that data is read in parallel from a selected column of said M memory cells.

2. The integrated circuit of claim 1, wherein said memory cell array is selected from the group consisting of a 16×16, 32×32 or a 128×128 memory array cell.

3. The integrated circuit of claim 1, wherein said memory cell array is a cross coupled latched device.

4. The integrated circuit of claim 1, further comprising first and second n channel MOSFETs and first and second p channel MOSFETs, wherein each of said n channel MOSFETs are cross connected to each of said p channel MOSFETs.

5. The integrated circuit of claim 4, wherein the gate terminal of each of said p channel MOSFETs is coupled to the gate terminal of each of said corresponding n channel MOSFETs and to the source of terminal of said second p channel MOSFET.

6. A method of utilizing a memory array device, comprising the steps of:

providing an N×M memory array device configured in a column and row format, wherein each row is comprised of N memory cells and each column is comprised of M memory cells;

writing individual data bits from a computer in parallel across each of said N rows, thereby filling said N memory cells and said M memory cells of said memory array device; and reading said individual data bits from said N×M memory array device in parallel such that each of said N columns of said memory array device is read sequentially.

7. The method as set forth in claim 6, wherein in said providing step, said N×M memory array may be selected from the group consisting of a 16×16, 32×32 or 128×128 memory array cell.

8. The method as set forth in claim 6, wherein in said providing step at least two N×M memory array devices are provided.

9. A method of utilizing a memory cell array comprising:

providing a plurality of N×M memory cells configured in a column and row format, wherein each row comprises of N memory cells and each column comprises of M memory cells;

receiving a data bit from a data input line via a data input switch coupled to each one of said memory cells;

providing a data bit to a data output line via a data output switch couple to each of said memory cells;

activating said data input switches across a row of said memory cells with a row control line configured to carry a write row select signal during a write operation, said write operation for writing said data bits in parallel; and activating said data output switches across a column of said memory cells with a column control line configured to carry a read column select signal during a read operation, said read operation for reading said data bits in parallel.

* * * * *